United States Patent [19]

Mohri et al.

[11] Patent Number: 4,808,114

[45] Date of Patent: Feb. 28, 1989

[54] I/O UNIT TERMINAL BASE WITH EXTERNAL CONNECTION TERMINALS, SOCKET FOR MOUNTING RELAYS, AND CONNECTOR FOR CABLE TO CPU

[75] Inventors: Masayuki Mohri, Yamaga; Keiji Matsumoto, Kobe, both of Japan

[73] Assignee: 501 Omron Tateisi Electronics Co., Kyoto, Japan

[21] Appl. No.: 103,317

[22] Filed: Oct. 1, 1987

[30] Foreign Application Priority Data

Oct. 2, 1986 [JP] Japan ............................ 61-234920

[51] Int. Cl.[4] .............................................. H01R 9/09
[52] U.S. Cl. ..................................... 439/76; 439/712; 439/716; 439/719
[58] Field of Search ........................ 439/709, 711–713, 439/715, 716, 721–723, 76, 719, 498, 493, 547, 638, 639, 650

[56] References Cited

U.S. PATENT DOCUMENTS

| | | | |
|---|---|---|---|
| 3,523,268 | 8/1970 | Foster | 439/712 |
| 3,883,210 | 5/1975 | Fujita et al. | 439/712 |
| 4,176,904 | 12/1979 | Obuch | 439/719 |
| 4,603,377 | 7/1986 | Kobayashi et al. | 439/716 |
| 4,685,753 | 8/1987 | Isshiki et al. | 439/74 |

Primary Examiner—Gil Weidenfeld
Assistant Examiner—Paula A. Austin
Attorney, Agent, or Firm—Wegner & Bretschneider

[57] ABSTRACT

This terminal base for an I/O unit includes a socket unit adapted for being mounted with several relays comprising several relay terminals. This socket unit includes several socket terminals which, when the relays are mounted to this socket unit, are contacted to the relay terminals. The terminal base also includes several I/O terminals, exposed to the outside for external connection, and connected to some of the socket terminals, and a multi wire connector, adapted to be connected to several wires for leading to a central processing unit, and having several connector terminals which are connected to some of the socket terminals. It may further include a printed circuit base board on which the I/O terminals and the socket terminals are mounted. Thereby, the manufacture and assembly of the terminal base, and of the I/O unit as a whole, are simplified and reduced in cost, while the servicability and ease of diagnosis of the I/O unit are good.

2 Claims, 5 Drawing Sheets

I/O UNIT TERMINAL BASE WITH EXTERNAL CONNECTION TERMINALS, SOCKET FOR MOUNTING RELAYS, AND CONNECTOR FOR CABLE TO CPU

BACKGROUND OF THE INVENTION

The present invention relates to a terminal base for an I/O unit, and particularly relates to such a terminal base for an I/O unit which is intended to be connected with a central processing unit of a computer system. Even more particularly, the present invention relates to such a terminal base for an I/O unit which is intended to be connected with a central processing unit of a computer system for processing inputs and outputs of said central processing unit, which particularly makes easy the work of installation and connection while retaining the virtues of easy servicability and manufacturing and assembly efficiency.

In the prior art, there have been proposed various types of I/O unit for use with central processing units of computer systems. Such an I/O unit, when used for output from the central processing unit, is tupically used for amplifying one or more outputs from said central processing unit by receiving said output or outputs and using it or them to switch one or more relays, the resulting signal or signals outputted from the relay or relays then being transmitted to the outside. On the other hand, when used for input to the central processing unit, such an I/O unit is typically used for amplifying one or more inputs to said central processing unit by receiving said input or inputs and using it or them to switch one or more relays, the resulting signal or signals outputted from the relay or relays, which is a TTL (transistor-transistor-logic) signal then being transmitted to the central processing unit. Two prior art types of such I/O units will now be explained with regard to FIGS. 1 and 2 of the appended drawings, which are schematic perspective partly phantom views of said prior art type I/O units.

First, referring to FIG. 1, this first conventional type of I/O unit, denoted as 31, comprises a CPU (central processing unit) 32, which receives inputs and which produces outputs. A rack 33 is provided within the I/O unit 31, and in this rack 33 there are slotted a plurality of printed circuit boards 34. A terminal base 36 is also provided as fitted within the I/O unit 31. On each of the printed circuit boards 34 there are mounted one or more of a plurality of relay units 35, and a first plurality of wires 41 connects the CPU 32 to the rack 33 and to the printed circuit boards 34 therein, while a second plurality of wires 42 connects the rack 33 and the printed circuit boards 34 therein to the terminal base 36. And a third plurality of wires 43, extending from devices exterior to this I/O unit 31 and not particularly shown, is connected to the terminal base 36. Thus, a typical output from the CPU 32 is transmitted via one or more of the plurality of wires 41 to the rack 33 and to an appropriate one or more of the relays 35 mounted on the printed circuit boards 34 fitted in said rack 33, and actuates said one or more of said relays 35 to produce an amplified output signal which is then fed to the wires 43 on the outside via one or more of the plurality of wires 42 and via the terminal base 36. Similarly, a typical input for being fed to the CPU 32 is transmitted from the outside through the wires 43 to one or more of the plurality of wires 42 via the terminal base 36, and then is fed to an appropriate one or more of the relays 35 mounted on the printed circuit boards 34 fitted in the rack 33, and is converted into (for example) a TTL level signal, which is then fed via one or more of the plurality of wires 41 to the CPU 32.

Further, referring to FIG. 2, a second conventional type of I/O unit, also denoted as 31, similarly comprises a CPU (central processing unit) 32, which similarly receives inputs and which produces outputs. A socket 37 is provided within the I/O unit 31, and in this socket 37 there are fitted a plurality of relay units 35. A terminal base 36 is also provided as fitted within the I/O unit 31. A first plurality of wires 41 connects the CPU 32 to the socket 37 and to the relay units 35 fitted therein, while a second plurality of wires 42 connects the socket 37 and the relay units 35 fitted therein to the terminal base 36. And a third plurality of wires 43, extending from devices exterior to this I/O unit 31 and not particularly shown, is connected to the terminal base 36. Thus, a typical output from the CPU 32 is transmitted via one or more of the plurality of wires 41 to the socket 37 and to an appropriate one or more of the relays 35 fitted in said socket 37, and actuates said one or more of said relays 35 to produce an amplified output signal which is then fed to the wires 43 on the outside via one or more of the plurality of wires 42 and via the terminal base 36. Similarly, a typical input for being fed to the CPU 32 is transmitted from the outside through the wires 43 to one or more of the plurality of wires 42 via the terminal base 36, and then if fed to an appropriate one or more of the relays 35 fitted in the socket 37, and is converted into (for example) a TTL level signal, which is then fed via one or more of the plurality of wires 41 to the CPU 32.

However, the I/O unit of the first type shown in FIG. 1 is subject to the problems that, since all of the relay units 35 are mounted on the printed circuit boards 34, the replacement of any ones of said relay units 35 which may be faulty is not easy, and further the diagnosis of which one or ones of said relay units 35 which actually is faulty is relatively difficult. Thus, the efficiency of maintenance of this first type I/O unit is relatively low. Further, much wiring is required to be provided inside the casing of this I/O unit 31, and accordingly the efficiency of manufacture and of assembly of this I/O unit 31 is relatively low.

On the other hand, in the case of the I/O unit of the second type shown in FIG. 2, it is true that the replacement of any ones of said relay units 35 which may be faulty is easier than in the case of the FIG. 1 type of I/O unit, and further it is true that the diagnosis of which one or ones of said relay units 35 which actually is faulty is easier than in the case of said FIG. 1 type of I/O unit. Accordingly, this second type of I/O unit is more advantageous as regards efficiency of maintenance than is the first type of I/O unit. However, since also in this second type of I/O unit still a double set of wiring is required to be provided inside its casing—i.e., both the plurality of wires 41 between the CPU 32 and the socket 37 and also the plurality of wires 41 between the socket 37 and the terminal base 36 are required to be provided—accordingly the efficiency of manufacture and of assembly of this second type of I/O unit are no better than the efficiency of manufacture and of assembly of the first type of I/O unit shown in FIG. 1 and described above.

SUMMARY OF THE INVENTION

Accordingly, there has become evident a requirement for an improved I/O unit, and particularly for an improved version of the terminal base therefor. This problem has exercised the ingenuity of the inventors of the present invention.

Thus, it is the primary object of the present invention to provide a terminal base for an I/O unit, which avoids the various problems detailed above.

It is a further object of the present invention to provide such a terminal base for an I/O unit, which eliminates the need for installation of two sets of wiring in the I/O unit.

It is a further object of the present invention to provide such a terminal base for an I/O unit, which allows of simple mounting and demounting of relay units thereto.

It is a further objct of the present invention to provide such a terminal base for an I/O unit, which allows of simple connection of a central processing unit thereto.

It is a yet further object of the present invention to provide such a terminal base for an I/O unit, which has good efficiency of manufacture.

It is a yet further object of the present invention to provide such a terminal base for an I/O unit, which has good efficiency of assembly.

It is a yet further object of the present invention to provide such a terminal base for an I/O unit, which has good efficiency of maintenance.

It is a yet further object of the present invention to provide such a terminal base for an I/O unit, which has good efficiency of diagnostic servicing.

It is a yet further object of the present invention to provide such a terminal base for an I/O unit, which can be fitted efficiently to a control box or the like.

It is a yet further object of the present invention to provide such a terminal base for an I/O unit, which can minimize the cost of a finished product incorporating it.

According to the most general aspect of the present invention, these and other objects are attained by, for an I/O unit: a terminal base, comprising: (a) a socket unit adapted for being mounted with a plurality of relays comprising a plurality of relay terminals, comprising a plurality of socket terminals which, when said plurality of relays are mounted to said socket unit, are contacted to said plurality of relay terminals; (b) a plurality of I/O terminals, exposed to the outside for external connection, and connected to some of said socket terminals; and: (c) a multi wire connector, adapted to be connected to a plurality of wires for leading to a central processing unit, and comprising a plurality of connector terminals which are connected to some of said socket terminals. This terminal base for an I/O unit may further comprise a printed circuit base board on which said I/O terminals and aid socket terminals are mounted.

According to such a terminal base for an I/O unit as specified above, it will be understood that the need for installation of two sets of wiring in the I/O unit is eliminated, and that further this novel type of terminal base for an I/O unit allows of simple mounting and demounting of the relay units thereto. Further, this terminal base for an I/O unit allows of simple connection of the central processing unit thereto, simply by a ribbon cable or the like being connected to the connector. Because no double wiring is required to be performed within the I/O unit, as was the case in the prior are outlined previously, this terminal base for an I/O unit allows of good efficiency of manufacture of the I/O unit as a whole, and also allows of good efficiency of assembly thereof. Because the relay units may be conveniently fitted as simple plug in units, this I/O unit further has good efficiency of maintenance and good efficiency of diagnostic servicing; and, because it is a unitary assembly, this I/O unit can be fitted efficiently to a control box or the like, thus minimizing the cost of such a finished product incorporating said I/O unit.

BRIEF DESCRIPTION OF THE DRAWINGS

The present invention will now be described with respect to the preferred embodiment thereof, and with reference to the illustrative drawings appended hereto, which however are provided for the purposes of explanation and exemplification only, and are not intended to be limitative of the scope of the present invention in any way, since this scope is to be delimited solely by the accompanying claims. With relation to the figures, spatial terms are to be understood as referring only to the orientation on the drawing paper of the illustrations of the relevant elements, unless otherwise specified; like reference symbols, unless otherwise so specified, denote the same parts and so on in the various figures relating to the preferred embodiment, and like parts and so on in the two figures relating to the prior arts; and:

DESCRIPTION OF THE PREFERRED EMBODIMENT

The present invention will now be described with reference to the preferred embodiment thereof, and with reference to the figures.

Figure 1:
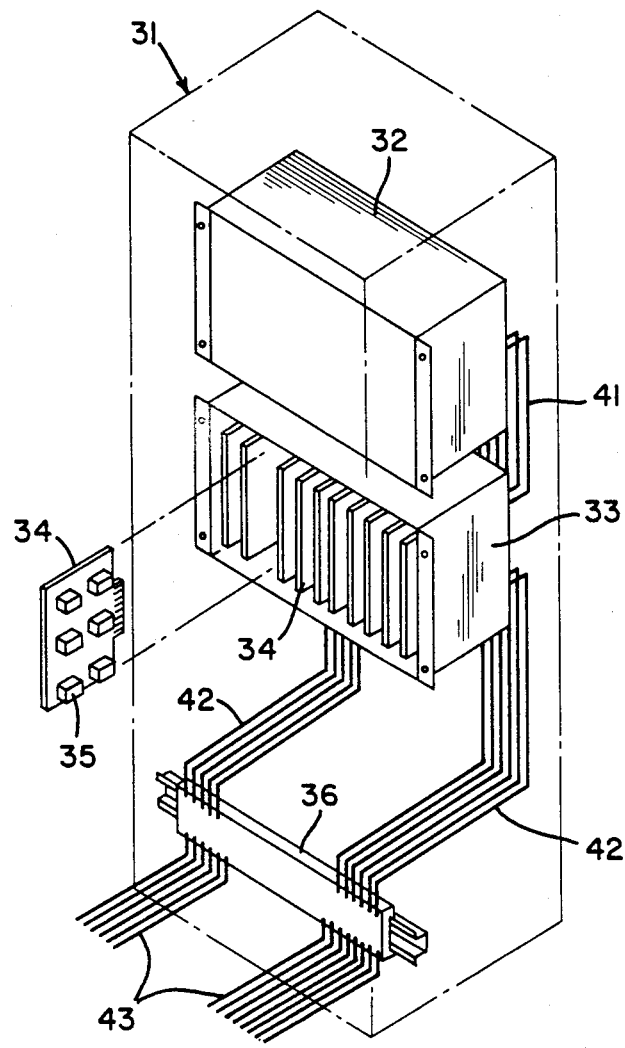
FIG. 1 is a schematic perspective partly phantom view of a first prior art type of I/O unit.
Figure 2:
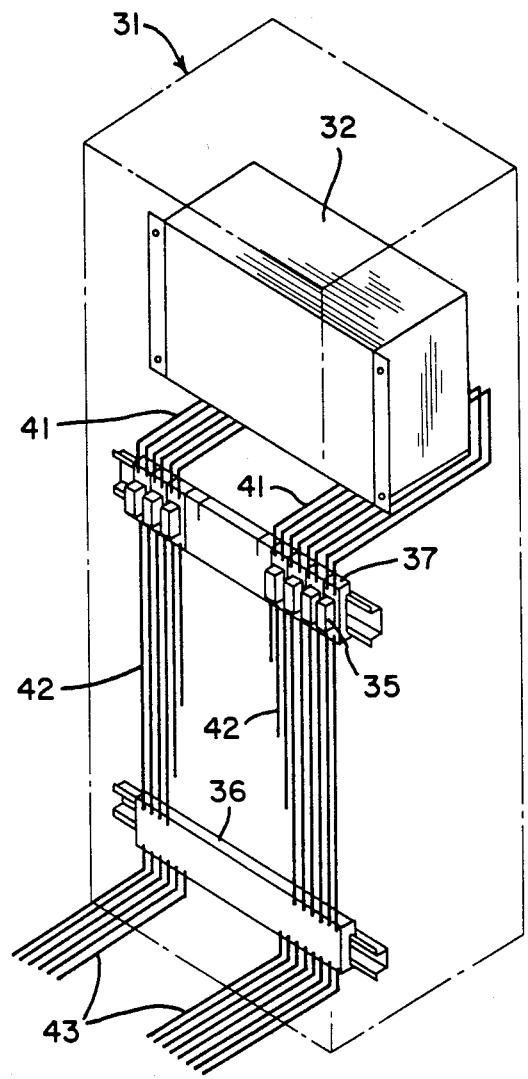
FIG. 2 is similar to FIG. 1, being a schematic perspective partly phantom view of a second prior art type of I/O unit.
Figure 3:
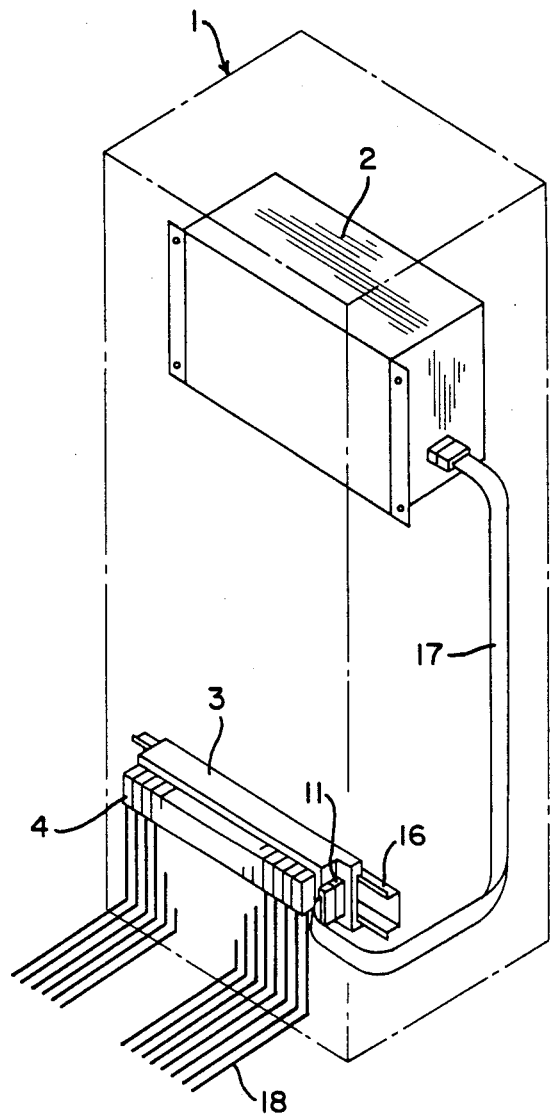
FIG. 3 is similar to FIGS. 1 and 2 relating to the prior art, and is a schematic perspective partly phantom view of an I/O unit incorporating the preferred embodiment of the terminal base for an I/O unit of the present invention.

FIG. 3 is similar to FIGS. 1 and 2 relating to the prior art, and is a schematic perspective partly phantom view of an I/O unit incorporating the preferred embodiment of the terminal base for an I/O unit of the present invention. In this figure, the reference numeral 1 generally denotes the I/O unit as a whole, and this I/O unit 1 comprises a CPU (central processing unit) 2, which receives inputs and which produces outputs, as is of course per se conventional. A terminal base 3, which in fact is the preferred embodiment of the terminal base for an I/O unit of the present invention, is provided within the I/O unit 1, and in this terminal base 3 there are removably mounted a plurality of relay units 4. A flat ribbon type cable 17, in fact of course consisting of a plurality of wires, connects the CPU 2 to the terminal base 3 via a connector 11 and to the relay units 4 mounted thereon, while a plurality of wires 18, extending from devices exterior to this I/O unit 1 and not particularly shown, is connected to the terminal base 3. Thus, a typical output from the CPU 2 is transmitted therefrom via one or more of the plurality of wires included in the ribbon cable 17 and through the connector 11 to the terminal base 3 and to an appropriate one or more of the relays 4 mounted to said terminal base 3, and actuates said one or more of said relays 4 to produce an amplified output signal which is then fed to the wires 18 on the outside via the terminal base 3. Similarly, a typical input for being fed to the CPU 2 is transmitted from the outside through the wires 18 to the terminal base 3, and then is fed to an appropriate one or more of the relays 4 fitted to said terminal base 3, and is converted into (for example) a TTL level signal, which is then fed to the CPU 2 through the connector 11 having therein terminals or contacts 15 and via one or more of the plurality of wires included in the ribbon cable 17. This terminal base 3 is mounted within the casing of the I/O unit 1 on a fixed support rail 16.

Figure 4:
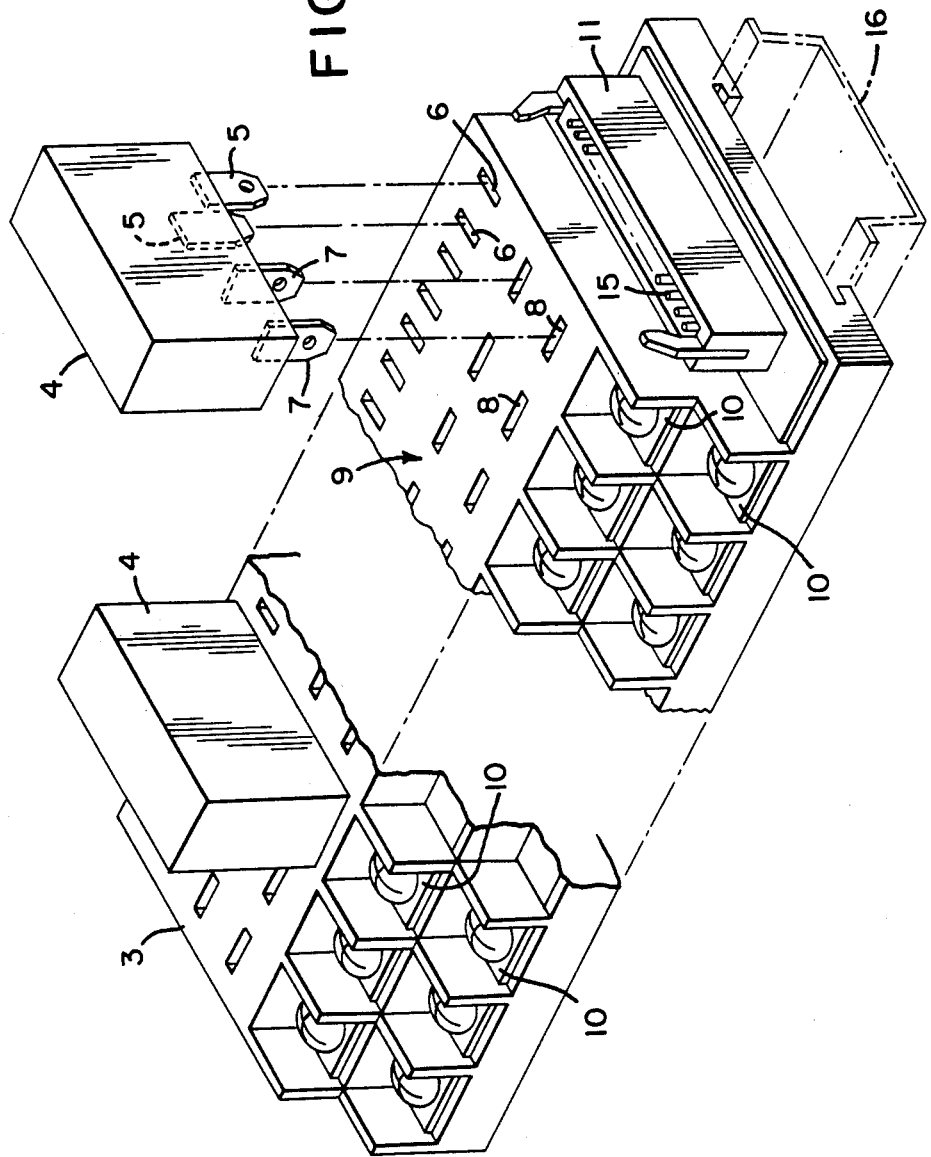
FIG. 4 is a perspective view of said preferred embodiment of the terminal base for an I/O unit of the present invention, and also shows a first relay unit as fitted to said preferred embodiment terminal base and a second relay unit as removed from said preferred embodiment terminal base.

Referring next to FIG. 4, in this figure this terminal base 3, which is the preferred embodiment of the terminal base for an I/O unit of the present invention, is shown in a more detailed perspective view; and two of the relay units 4 are shown, one as fitted to said terminal base 3 and one as removed from said terminal base 3. In detail, the upper surface of this terminal base 3 is formed as a socket unit 9 which has a plurality of receiving holes 6 for receiving input terminals 5 and a plurality of receiving holes 8 for receiving output terminals 7 of the relay units 4 which are to be fitted to this terminal base 3, two typical ones of said relay units 4 being shown in the figure. Further, along one side of this terminal base 3 there are arranged a plurality of output terminals 10, said output terminals 10 being in this preferred embodiment arranged in two parallel lines, and further at one end of this terminal base 3 there is provided the connector 11, which is a multi wire type connector, for receiving the end of the ribbon cable 17 as connected to it.

Figure 5:
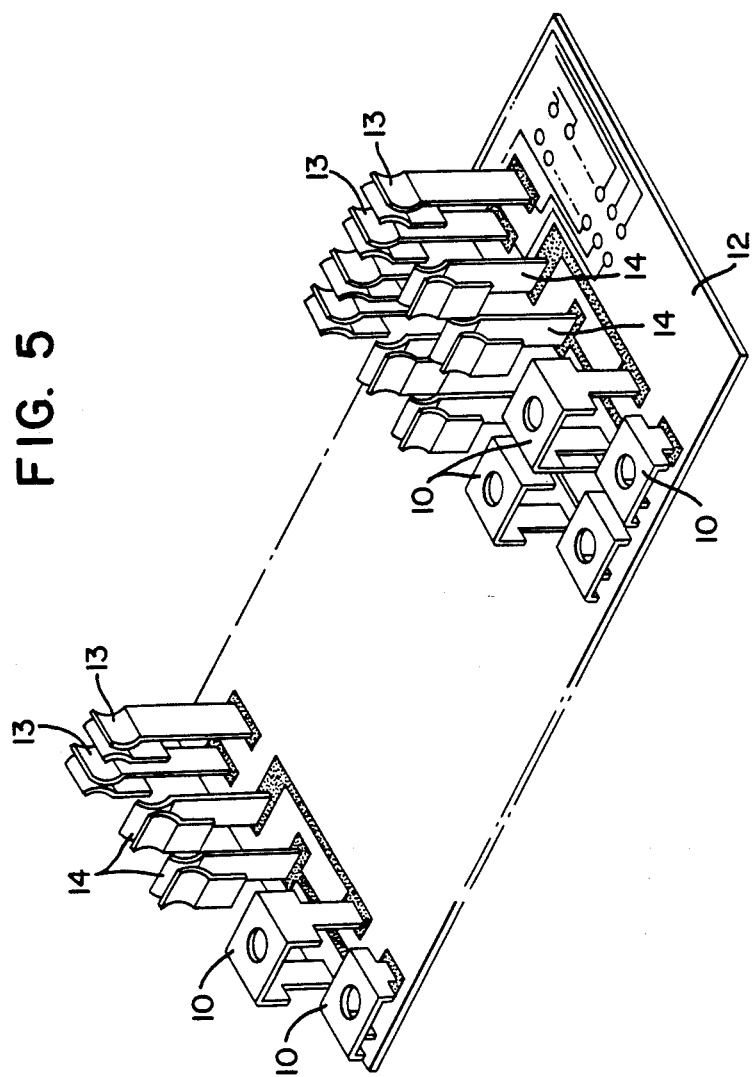
FIG. 5 is a perspective view of a printed circuit board and various components mounted thereon, said printed circuit board being incorporated in said preferred embodiment of the terminal base for an I/O unit of the present invention.

Within this terminal base 3 there is housed, in this preferred embodiment of the present invention, a printed circuit board which is shown in partial perspective view in FIG. 5 and which is therein designated by the reference numeral 12. On this printed circuit board 12 there are fixedly mounted the aforementioned output terminals 10, and further there are provided sets of input contact terminals 13 and output contact terminals 14 in positions which oppose, respectively, the receiving holes 6 for receiving the input terminals 5 of the relay units 4 and the receiving holes 8 for receiving the output terminals 7 of said relay units 4. The output contact terminals 14 are connected to the output terminals 10 of the terminal base 3 by way of printed circuit traces, not particularly shown, laid on the printed circuit board 12, while the input contact terminals 13 are connected to the various contact terminals of the multi wire type connector 11, also by way of printed circuit traces not particularly shown laid on said printed circuit board 12.

Thus, the ribbon cable 17 may be conveniently and quickly coupled to the connector 11, so as to connect the CPU 2 to the relays 4, while further, during fitting of this I/O unit to a system or device, the external wires 18 also may be quickly and conveniently connected to the output terminals 10 by the use of small screws or the like.

Thus, according to this preferred embodiment of the terminal base for an I/O unit of the present invention, it will be understood that the need for installation of two sets of wiring in the I/O unit is eliminated, and that further this novel type of terminal base for an I/O unit allows of simple mounting and demounting of the relay units 4 thereto, simply by the relay units 4 being plugged into the terminal base 3. Further, this terminal base for an I/O unit allows of simple connection of the central processing unit 2 thereto, simply by the ribbon cable 17 (or, more exactly, a terminal connection piece attached to the end thereof) being connected to the connector 16. Because no double wiring is required to be performed within the I/O unit, as was the case in the prior art outlined above, this terminal base for an I/O unit allows of good efficiency of manufacture of the I/O unit as a whole, and also allows of good efficiency of assembly thereof. Because the relay units 4 are fitted as simple plug in units, this I/O unit further has good efficiency of maintenance and good efficiency of diagnostic servicing; and, because it is a unitary assembly, this I/O unit can be fitted efficiently to a control box or the like, thus minimizing the cost of such a finished product incorporating said I/O unit.

As a matter of course, the connection between the CPU 2 and the terminal base 3 could alternatively be provided, not by the single ribbon type cable 17 and by the single connector 11 as was the case in the above disclosed preferred embodiment, but by a plurality of such cables and a corresponding plurality of connectors, in the event that a large number of such connection lines were required. All such variations should be considered as being within the scope of the present invention. Further, although the above description has, in terms of the use of the expressions "input" and "output", been slanted towards the case in which the relay units 4 are used for amplifying the output signals of the CPU 2, of course the present invention is equally applicable to the case in which some or indeed all of said relay units 4 are used as input relays which convert the level of input signals for said CPU 2 to an appropriate signal level such as a TTL signal level. Again, all such variations should be considered as being within the scope of the present invention.

It is acceptable, according to the princple of the present invention, if the constructional details of the system are varied, although the shown ones are considered to be preferred. Therefore, although the present invention has been shown and described in terms of the preferred embodiment thereof, and with reference to the appended drawings, it should not be considered as being particularly limited thereby, since the details of any particular embodiment, or of the drawings, could be varied without, in many cases, departing from the ambit of the present invention. Accordingly, the scope of the present invention is to be considered as being delimited, not by any particular perhaps entirely fortuitous details of the disclosed preferred embodiment, or of the drawings, but solely by the scope of the accompanying claims, which follow.

What is claimed is:
1. For an I/O unit:
a terminal base, comprising:
(a) a socket unit adapted for being mounted with a plurality of relays comprising a plurality of relay terminals and comprising a plurality of socket terminals which, when said plurality of relays are mounted to said socket unit, are contacted to said plurality of relay terminals;
(b) a plurality of I/O terminals, exposed to the outside for external connection, and connected to some of said socket terminals; and:
(c) a multi wire connector, adapted to be connected to a plurality of wires for leading to a central processing unit, and comprising a plurality of connector terminals which are connected to some of said socket terminals.

2. A terminal base for an I/O unit according to claim 1, further comprising a printed circuit base board on which said I/O terminals and said socket terminals are mounted.

* * * * *